(12) United States Patent
Chang et al.

(10) Patent No.: US 9,684,214 B2
(45) Date of Patent: Jun. 20, 2017

(54) DISPLAY DEVICE

(71) Applicant: InnoLux Corporation, Miao-Li County (TW)

(72) Inventors: Jung-Fang Chang, Miao-Li County (TW); Chih-Hao Wu, Miao-Li County (TW); Chao-Hsiang Wang, Miao-Li County (TW); Yi-Ching Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/669,557

(22) Filed: Mar. 26, 2015

(65) Prior Publication Data
US 2015/0338711 A1   Nov. 26, 2015

(30) Foreign Application Priority Data
May 21, 2014   (TW) .............................. 103117752 A

(51) Int. Cl.
| | |
|---|---|
| *G02F 1/1362* | (2006.01) |
| *G02F 1/1368* | (2006.01) |
| *H01L 29/417* | (2006.01) |
| *H01L 23/538* | (2006.01) |
| *H01L 27/112* | (2006.01) |

(Continued)

(52) U.S. Cl.
CPC ...... *G02F 1/136286* (2013.01); *G02F 1/1368* (2013.01); *G02F 1/136277* (2013.01); *H01L 23/538* (2013.01); *H01L 27/124* (2013.01); *H01L 27/1222* (2013.01); *H01L 29/41733* (2013.01); *H01L 29/42384* (2013.01); *H01L 29/78696* (2013.01); *G02F 1/13452* (2013.01); *G02F 2001/13606* (2013.01); *G02F 2001/133388* (2013.01);

(Continued)

(58) Field of Classification Search
CPC ......... G02F 1/136277; G02F 1/136286; H01L 29/42384
USPC .......................................................... 257/91
See application file for complete search history.

(56) References Cited

U.S. PATENT DOCUMENTS 5,847,781 A * 12/1998 Ono ................... G02F 1/13458
349/111
6,411,350 B2 * 6/2002 Ejiri ............................ 349/149
(Continued)

FOREIGN PATENT DOCUMENTS

| JP | 667189 A | 3/1994 |
|---|---|---|
| JP | 2002343953 A | 11/2002 |

*Primary Examiner* — Jarrett Stark
*Assistant Examiner* — Charles N Ausar-El
(74) *Attorney, Agent, or Firm* — Bacon & Thomas, PLLC

(57) ABSTRACT

The present invention relates to a display device, comprising: a substrate comprising a display region and a non-display region surrounding the display region; a first conductive layer disposed on the substrate; a semiconductor layer disposed on the substrate and partially covering the first conductive layer; and a second conductive layer disposed on a top surface of the semiconductor layer; and there is a spacing between a first side of the semiconductor layer and a second side of the second conductive layer from a top view, wherein the first side of the semiconductor layer is adjacent to the second side of the second conductive layer; wherein the spacing in the display region is a first distance, the spacing in the non-display region is a second distance, and the first distance is smaller than the second distance.

12 Claims, 8 Drawing Sheets

(51) Int. Cl.
*H01L 29/423* (2006.01)
*H01L 27/12* (2006.01)
*H01L 29/786* (2006.01)
*G02F 1/1345* (2006.01)
*G02F 1/1333* (2006.01)
*G02F 1/136* (2006.01)

(52) U.S. Cl.
CPC ............ *G02F 2001/136236* (2013.01); *H01L 27/1288* (2013.01); *H01L 2924/0002* (2013.01)

(56) References Cited

U.S. PATENT DOCUMENTS

| | | | |
|---|---|---|---|
| 7,663,724 B2 * | 2/2010 | Lim | G02F 1/134363 349/141 |
| 2002/0064894 A1 * | 5/2002 | Lee | H01L 29/66765 438/30 |
| 2004/0036815 A1 * | 2/2004 | Kim | G02F 1/1362 349/38 |
| 2006/0139544 A1 * | 6/2006 | Ko | G02F 1/134363 349/141 |
| 2007/0258035 A1 * | 11/2007 | Wang | G02F 1/136286 349/187 |
| 2011/0310341 A1 * | 12/2011 | Kim | H01L 27/1288 349/140 |
| 2013/0240890 A1 * | 9/2013 | Chang | G02F 1/1333 257/59 |
| 2014/0306222 A1 * | 10/2014 | Wu | H01L 27/1255 257/57 |
| 2014/0339563 A1 * | 11/2014 | Huang | H01L 27/124 257/72 |
| 2015/0219944 A1 * | 8/2015 | Mitsumoto | G02F 1/1339 349/138 |

* cited by examiner

DISPLAY DEVICE

CROSS REFERENCE TO RELATED APPLICATION

This application claims the benefits of the Taiwan Patent Application Ser. No. 103117752, filed on May 21, 2014, the subject matter of which is incorporated herein by reference.

BACKGROUND OF THE INVENTION

1. Field of the Invention

The present invention relates to a display device, and especially to a display device able to reduce the resistance and avoid the electrical interference between the first conductive layer and the second conductive layer.

2. Description of Related Art

Since the technology of display devices developed quickly, the display devices with thin thickness, low weight, and compact size are the major products on the market. In fact, the old cathode-ray tube displays are greatly replaced by the liquid crystal displays (LCD) in major areas around the world. Nowadays, the liquid crystal displays (LCD) is widely applied in many electrical devices such as mobile phones, notebook computers, cameras, video recorders, music players, global positioning system devices, and televisions. Moreover, since the demand of the devices with human-friendly operation, and simplification is strong, the display device with touch panel will be widely used in people's daily life.

The thin film transistor liquid crystal display (TFT-LCD) uses the thin film transistor technology to improve the image quality. In short, the TFT-LCD is made of two glass substrate and a liquid crystal layer located there between. The top glass substrate is a color filter substrate, and the bottom substrate is a transistor substrate. When a current is applied to the transistor, an electrical field generates and further rotates the liquid crystal molecules to change the polarity of the incident light. Through the assistance of foreign polarizers, the darkness or the brightness of pixels on the display can be controlled and adjusted. Hence, by controlling the brightness of plural pixels, the image of a frame can be displayed. Generally, many types of TFT-LCD are widely used now. The common types are twisted nematic (TN) type, super twisted nematic (STN) type, vertical alignment (VA) type, in-plane switching (IPS) type, and fringe field switching (FFS) type.

Even though the technologies of display device become much more matured now, the consumers' demand for high image quality is still strong. Hence, a display device with improved display quality is still needed to be made to meet the demand for the market.

SUMMARY OF THE INVENTION

An object of the present invention is to provide a display device able to reduce resistance, and prevent electrical disturbance between the first conductive layer and the second conductive layer.

To achieve the above object, the present invention provides a display device, comprising: a substrate comprising a display region and a non-display region surrounding the display region; a first conductive layer disposed on the substrate; a semiconductor layer disposed on the substrate and having a first portion and a second portion, wherein the first conductive layer is located between the first portion and the substrate, and the second portion doesn't overlap the first conductive layer; and a second conductive layer disposed on a top surface of the semiconductor layer, and combined with the first conductor layer and the semiconductor layer to form plural thin film transistors located in the display region, wherein the second conductive layer comprises plural data lines, each data line has a first side and a second side, the first side and the second side are arranged with an interval, and part of the first side is near to a channel of one of thin film transistors corresponding to the first side; wherein the second side of each data line is spaced from the neighboring side of the semiconductor layer in a first distance on the first portion of the semiconductor layer, the second side of each data line is spaced from the neighboring side of the semiconductor layer in a second distance on the second portion of the semiconductor layer, and the first distance is greater than the second distance.

The present invention provides another display device, comprising: a substrate comprising a display region and a non-display region surrounding the display region; a first conductive layer disposed on the substrate; a semiconductor layer disposed on the substrate and partially covering the first conductive layer, and there is a spacing between a first side of the semiconductor layer and a second side of the second conductive layer from a top view, wherein the first side of the semiconductor layer is adjacent to the second side of the second conductive layer; wherein the spacing in the display region is a first distance, the spacing in the non-display region is a second distance, and the first distance is smaller than the second distance.

As a result, in the display device of the present invention, because the first distance which is defined by the first portion of the semiconductor layer and the substrate having a first conductive layer there between to the second side of the neighboring data line is greater than the second distance which is defined by the second portion of the semiconductor layer and the substrate without a first conductive layer there between to the second side of the neighboring data line. That can avoid electrical disturbance between the first conductive layer and the second conductive layer, and avoid effective penetration percentage in the region without conductive layers. Besides, the fifth distance defined by one side of the second conductive layer in the non-display region and the neighboring side of the semiconductor layer located thereunder is greater than the sixth distance defined by one side of the corresponding second conductive layer in the display region and the neighboring side of the semiconductor layer located thereunder, so that it can reduce resistance effectively and avoid increasing parasite capacitance to affect efficiency of the liquid crystal.

DETAILED DESCRIPTION OF THE PREFERRED EMBODIMENT

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention, and those skilled in the art will appreciate that various modifications, additions and substitutions are possible.

Embodiment 1

Figure 1:
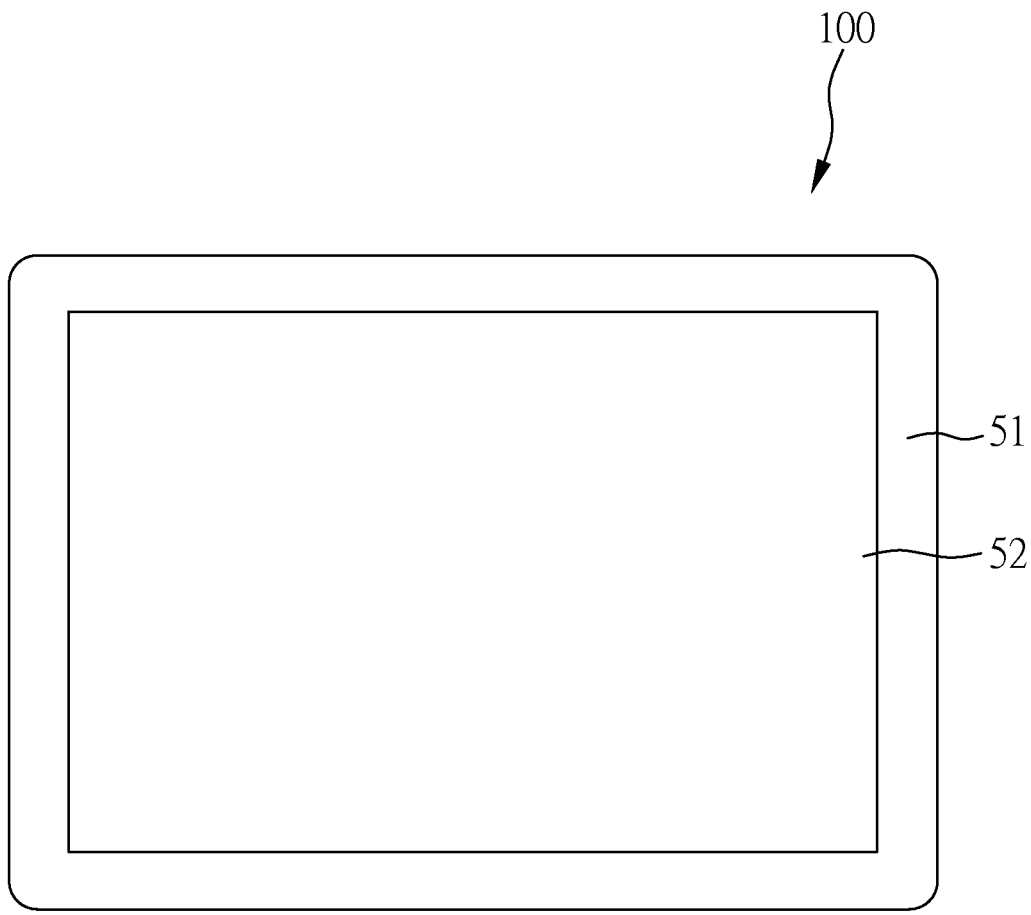
FIG. 1 shows the schematic diagram of the display device according to a preferable embodiment of the present invention.

Please refer to FIG. 1. A display device 100 including a non-display region 51 and a display region 52 is provided. The pixel structure in the display region 52 includes a substrate having a non-display region 51 and a display region 52 surrounding the display region 51; FIGS. 2A-2D show a first conductive layer 1 disposed on the substrate 5; an insulation layer 6 locating and covering the first conductive layer 1; a semiconductor layer 2 locating on the insulation layer 6 and having a first portion 21 and a second portion 22, wherein the first conductive layer 1 locates between the first portion 21 and the substrate 5, and the second portion 22 doesn't overlap the first conductive layer 1; and a second conductive layer 3 locating on the top surface of the semiconductor layer 2, and further including data lines 31 and electrodes 32 in the display region 52. Moreover, each data line 31 has a first side 311 and a second side 312, and the first side 311 is separated from the second side 312 through the data line 31. The first conductive layer 1, the semiconductor layer 2, and the second conductive layer 3 are combined together to form plural thin film transistors 4. One part of the first side 311 is near to the channel 7 of at least one thin film transistor 4. The second side 312 is not near to the channel 7 of the thin film transistor 4. The shape profile of the second side 312 is the same as that of side profile 23 of the semiconductor layer 2.

Figure 2A:
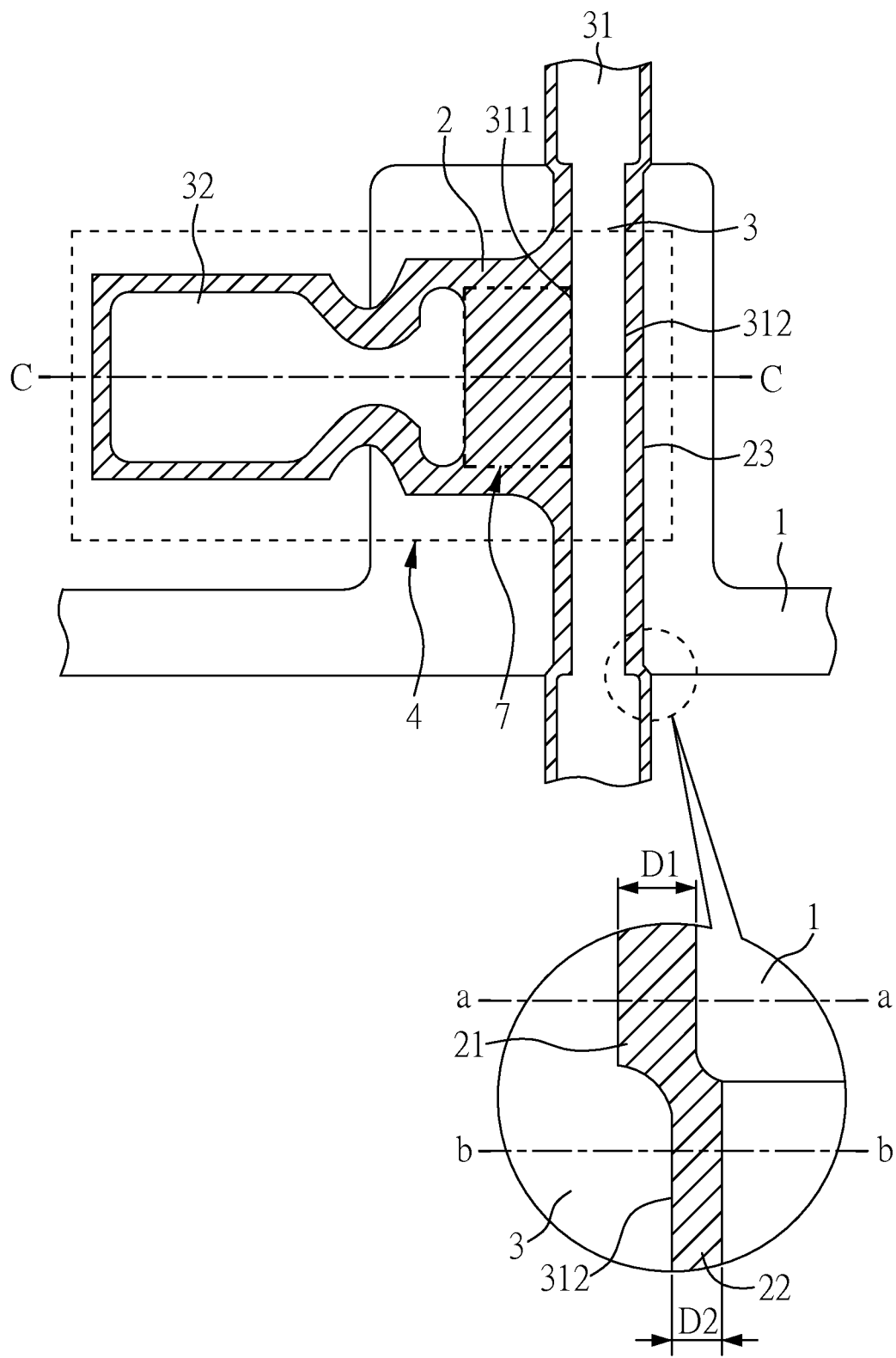
FIG. 2A shows the schematic diagram of the pixel structure in display region according to a preferable embodiment of the present invention.
Figure 2B:
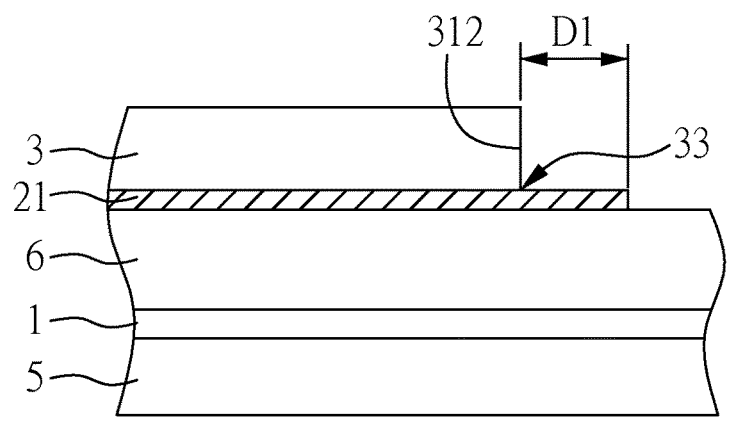
FIG. 2B shows the cross-sectional view of the section line "a" in FIG. 2A.
Figure 2C:
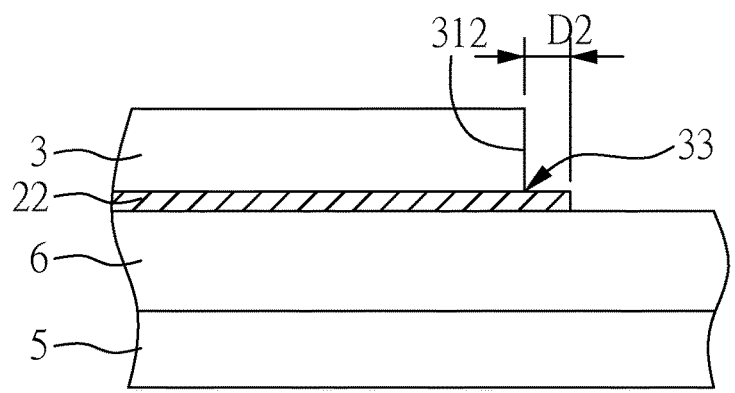
FIG. 2C shows the cross-sectional view of the section line "b" in FIG. 2A.

Please refer to the enlarged view diagram of the region in FIG. 2A. The second side 312 of the data line 31 is spaced from the neighboring side of the first portion 21 in a first distance D1. The second side 312 of the data line 31 is spaced from the neighboring side of the second portion 22 in a second distance D2 there between. Moreover, the first distance D1 is greater than the second distance D2. The cross-sectional view of the section line "a" is shown in FIG. 2B. The structure of the pixel subsequently includes a substrate 5, a first conductive layer 1, an insulation layer 6, a semiconductor layer 2 (i.e. the first portion 21 in this cross-sectional view), and a second conductive layer 3. The second side 312 of a data line 31 of the second conductive layer 3 contacts the semiconductor layer 2 with a first contact border 33. Then a first distance D1 is defined by the interval width between the first contact border 33 and the first portion 21 of the semiconductor layer 2. In addition, the cross-sectional view of the section line "b" is shown in FIG. 2C. The structure of the pixel subsequently includes a substrate 5, an insulation layer 6, a semiconductor layer 2 (i.e. the second portion 22 in this cross-sectional view), and a second conductive layer 3. Likewise, a second distance D2 is defined by the interval width between the first contact border 33 and the second portion 22 of the semiconductor layer 2. The first distance D1 is greater than the second distance D2.

Figure 2D:
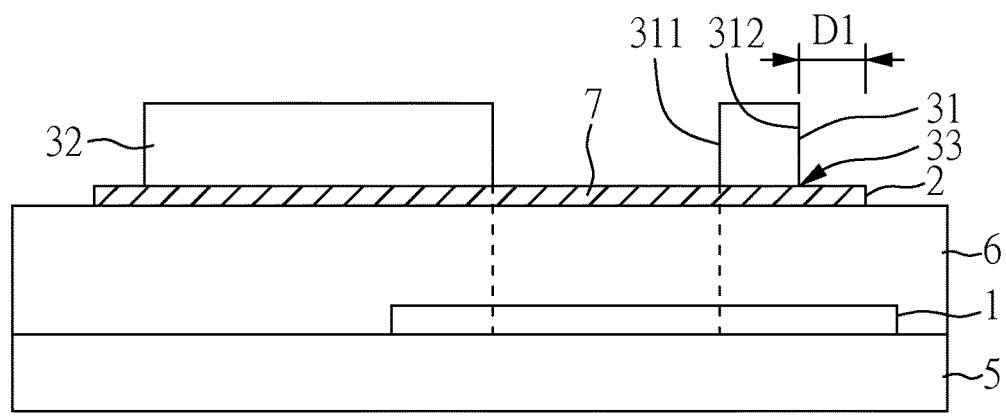
FIG. 2D shows the cross-sectional view of the section line "c" in FIG. 2A.

Referring to FIG. 2D, FIG. 2D is a cross-sectional view according to the sectional line "c" in FIG. 2A, and is the details of the structure of the thin film transistor 4 is shown here. The pixel structure subsequently includes a substrate 5, a first conductive layer 1 (including a gate), an insulation layer 6, a semiconductor layer 2 (including a channel 7), and a second conductive layer 3 (including a source, a drain made of a data line 31, and electrode 32, respectively). The first side 311 of the data line is close to one side of the channel 7, and the second side 312 locates on the other side opposite to the first side 311.

In the present embodiment, the first distance D1 is in a range of 0.7 μm to 1.5 μm, preferably 0.8 μm to 1.1 μm. The second distance D2 is in a range of 0.3 μm to 1.0 μm, preferably 0.5 μm to 0.7 μm. The ratio of first distance D1 to the second distance D2 preferably is 1.3 to 1.7, but is not limited thereto. If the first distance D1 and the second distance D2 is greater than the range illustrated above, then the achievement of the neighboring semiconductor layer 2 (i.e. the semiconductor layer 2 neighboring to the pixel) is not possible to be achieved in the manufacturing process. In addition, when the ratio of the first distance D1 to the second distance D2 is in the range described above, it can shield the electromagnetic interference and reduce the resistance of the data line.

Figure 3:
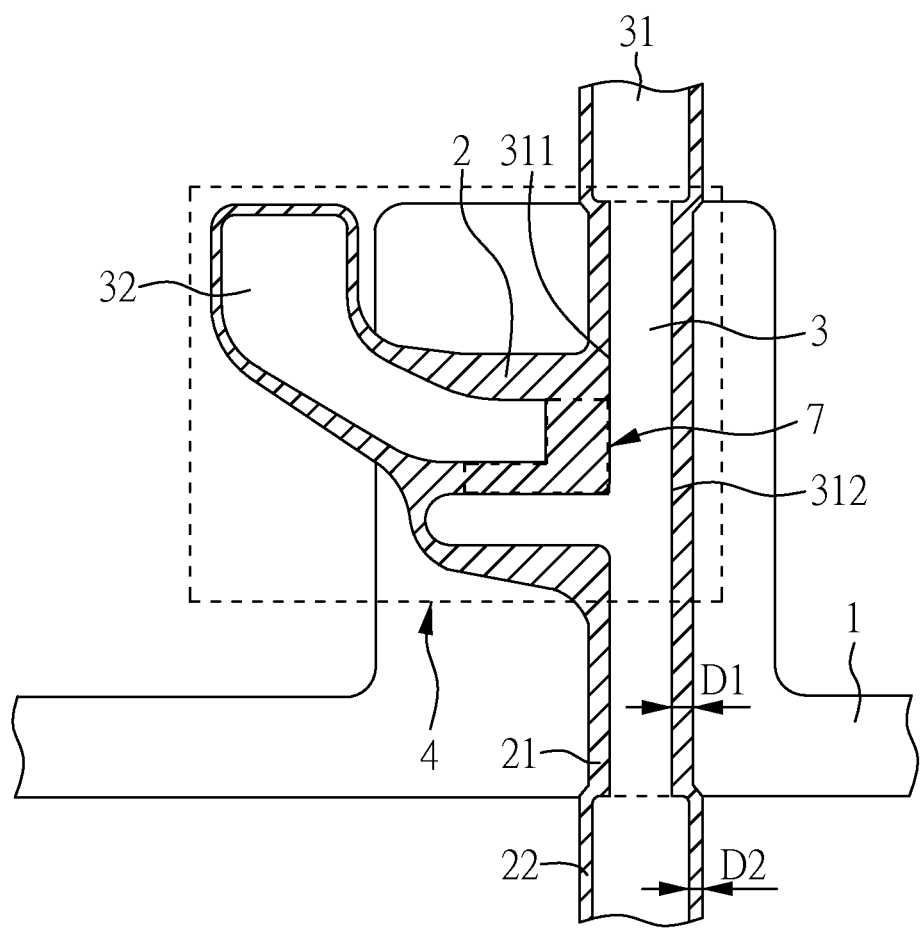
FIG. 3 shows the schematic diagram of the pixel structure in display region according to another preferable embodiment of the present invention.
Figure 4:
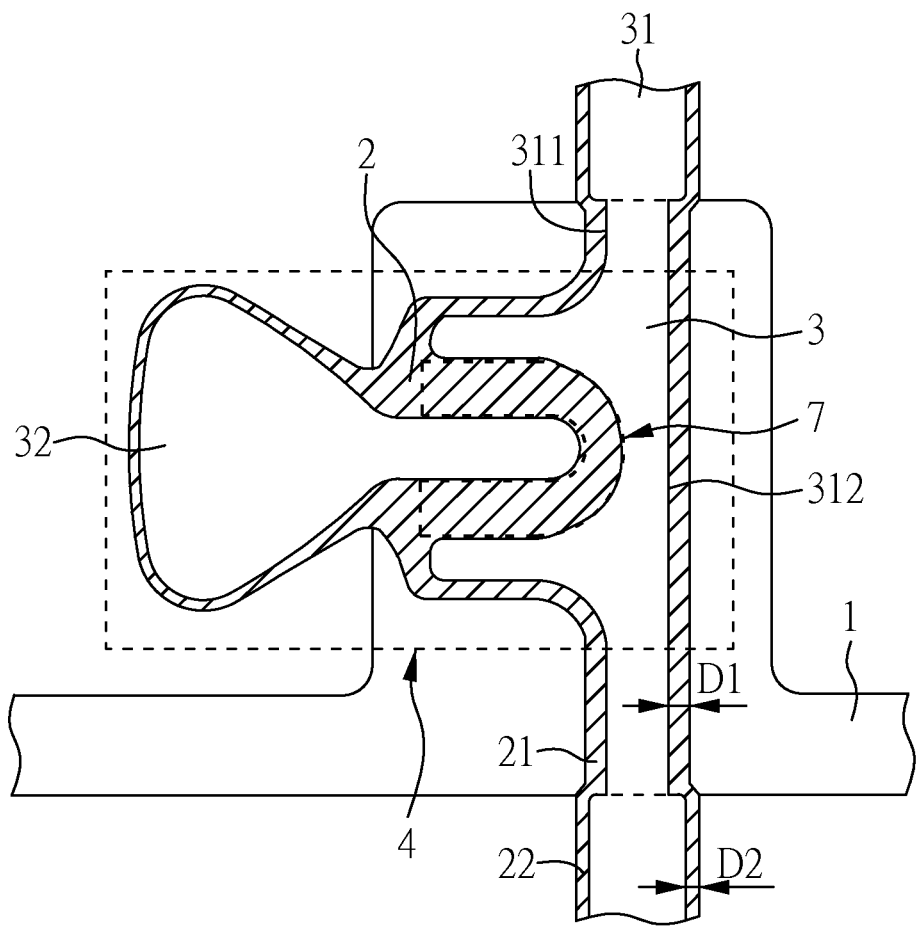
FIG. 4 shows the schematic diagram of the pixel structure in display region according to further another preferable embodiment of the present invention.

However, the pixel structure in the display region 52 is not limited thereto, and it can be any common structure known by the people skilled in the art. In FIG. 3, and FIG. 4, the structure characters are the same as those of FIG. 2A. The second side 312 of the data line 31 is spaced from one side of the first portion 21 with an interval of first distance D1, and the second side 312 of the data line 31 is spaced from one side of the second portion 22 with another interval of second distance D2. The first distance D1 is greater than the second distance D2.

Figure 5A:
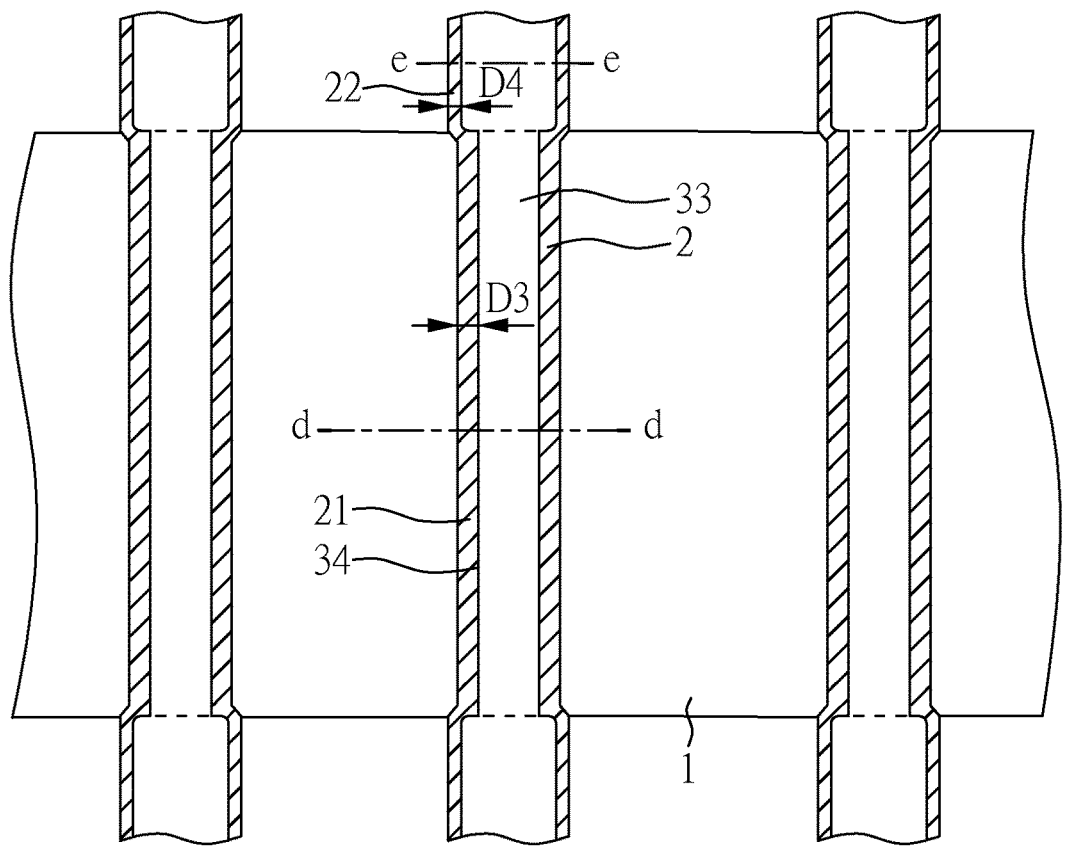
FIG. 5A shows the schematic diagram of the pixel structure in non-display region according to a preferable embodiment of the present invention.
Figure 5B:
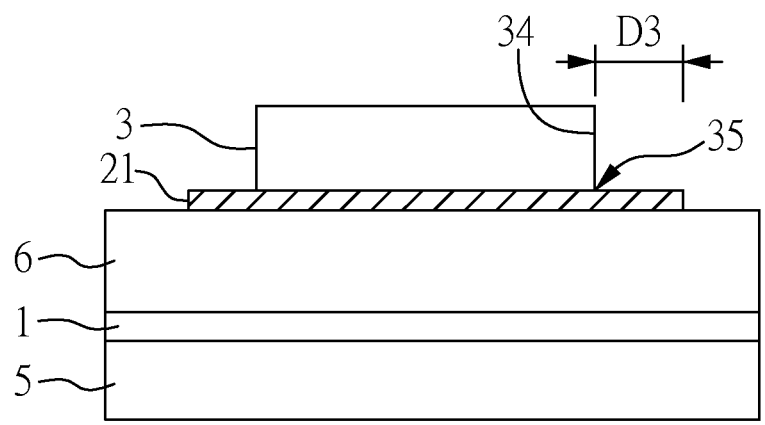
FIG. 5B shows the cross-sectional view of the section line "d" in FIG. 5A.
Figure 5C:
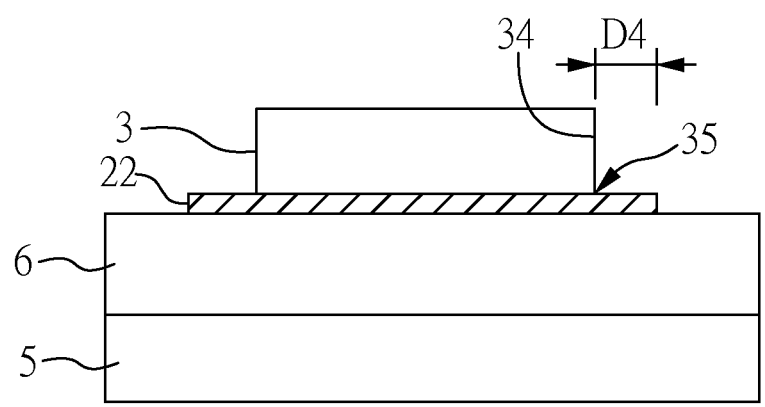
FIG. 5C shows the cross-sectional view of the section line "e" in FIG. 5C.

In addition, the pixel structure in the non-display region 51 is shown in FIG. 5A. The second conductive layer 3 includes plural circuit lines 33 in the non-display region 51. One side 34 of the circuit lines 33 and the neighboring side of the first portion 21 of the semiconductor layer 2 is separated by an interval of third distance D3, the side 34 of circuit lines 33 and the neighboring side of the second portion 22 of the semiconductor layer 2 is separated by an interval of fourth distance D4, and the third distance D3 is greater than the fourth distance D4. The cross-sectional view of the section line "d" is shown in FIG. 5B. The structure of the pixel subsequently includes a substrate 5, a first conductive layer 1, an insulation layer 6, a semiconductor layer 2, and a second conductive layer 3. The side 34 of a data line 3 of the second conductive layer 3 contacts the semiconductor layer 2 with a second contact border 35. The second contact border 35 and the neighboring side of the first portion 21 of the semiconductor layer 2 are separated by an interval of third distance D3. Furthermore, the cross-sectional view of the section line "e" is shown in FIG. 5C. The structure of the pixel subsequently includes a substrate 5, an insulation layer 6, a semiconductor 2, and a second conductive layer 3. The second contact border 35 and the neighboring side of the second portion 22 of the semiconductor layer 2 are separated by an interval of fourth distance D4. In the present embodiment, the third distance can be 1 µm to 2 µm, and preferably 1.4 µm to 1.7 µm.

In other words, by way of controlling the etching step or using a gray tone mask, the condition that the first distance D1 is greater than the second distance D2 and the third distance D3 is greater than the fourth distance D4 can be achieved. It is known that when a first conductive layer locates between the semiconductor layer 2 and the substrate 5, a parasite capacitance generates and the parasite capacitance further interferes with the transmission of electrical signals through the second conductive layer 3. However, the parasite capacitance can be reduced by shrinking the second conductive layer 3 on the semiconductor layer 2. Moreover, when the semiconductor layer 2 doesn't overlap the first conductive layer 1, the light scattering from the passing of the light from the backlight module can be improved, and the contrast deterioration caused by the scattering from the interface can be avoided by shortening the width of the second distance D2.

Furthermore, the third distance D3 defined by the second contact border 35 in the non-display region 51 and the first portion 21 of the semiconductor layer 2 is greater than the second distance D2 defined by the second side 312 of the data line 31 in the display region 52 and second portion 22 of the semiconductor layer 2, or the third distance D3 is greater than first distance D1 defined by the second side 312 of the data line 31 and the first portion 21.

To reduce the resistance of the circuit line 33 of the second conductive layer 3 in the non-display region 51, the distance (i.e. the third distance D3) between the circuit line 33 and the semiconductor layer 2 is increased. Then the resistance can be reduced and the efficient width of the conductive lines can be increased. Hence, in the present embodiment, the first distance D1 in the display region 52 is set to be greater than the second distance D2, and the third distance in the non-display region is set to be greater than the first distance D1 in the display region 52 at the same time to improve the display quality of the display device.

Embodiment 2

Figure 6:
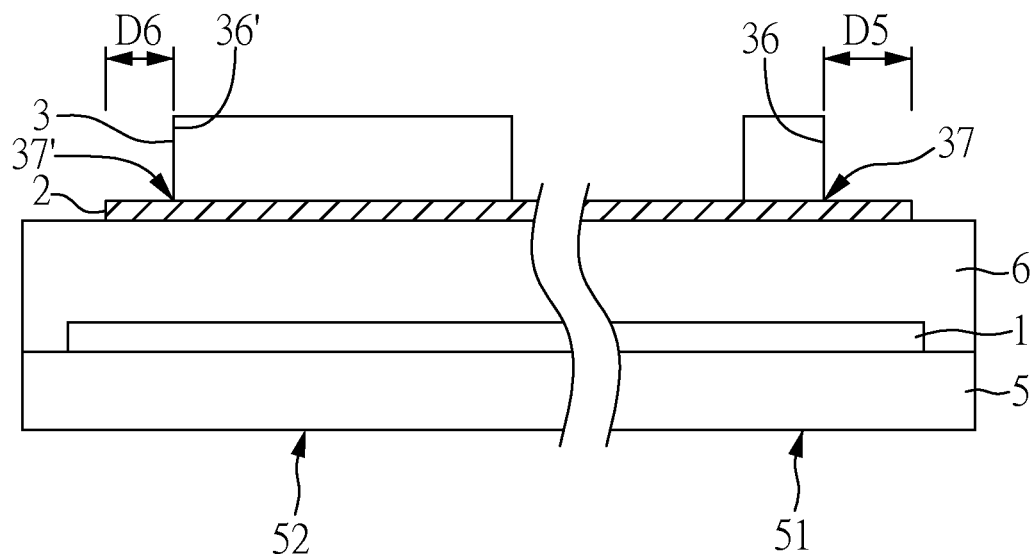
FIG. 6 shows the cross-sectional view of the pixel structure according to another preferable embodiment of the present invention.

Another display device (similar to the display device shown in FIG. 1, including a display region 52 and a non-display 51 surrounding the display region 52) is also provided in the present embodiment. Part of the pixel structure cross-sectional view (shown in FIG. 6) subsequently includes a substrate 5 including a display region 52 and a non-display 51, a first conductive layer 1 located on the substrate 5, an insulation layer 6 located on and covering the first conductive layer 1, a semiconductor layer 2 located on the substrate 5 and partially covering the first conductive layer 1, and a second conductive layer 3 formed on the top surface of the semiconductor layer 2. The sides 36, 36' of the second conductive layer contact with the semiconductor layers 2 through contact borders 37, 37'. The contact border 37 in the non-display region 51 and the neighboring side of the semiconductor layer 2 are separated by an interval of a fifth distance D5, the contact border 37' in the display region 52 and the neighboring side of the semiconductor layer 2 are separated by an interval of a sixth distance D6, and the fifth distance D5 is greater than the sixth distance D6.

In the present embodiment, the second conductive layer 3 may include plural data lines in the display region 52. Each data line has a first side and a second side, and the first side is separated from the second side through the data line. Moreover, part of the first side in the display region 52 is near to the channel of a thin film transistor, and the second side is not near to the channel of the thin film transistor. The shape of the second side is the same as that of the side profile of the semiconductor layer. The sixth distance D6 is the distance between the contact border 37' of the second side and the neighboring side of the semiconductor layer.

In the present embodiment, the fifth distance D5 may be in a range of 0.7 µm to 2.0 µm, and the sixth distance D6 may be in a range of 0.3 µm to 1.5 µm. The ratio of the fifth distance D5 to the sixth distance D6 is preferred to be 1.2 to 1.6, but the present invention is not limited thereto.

Figure 7:
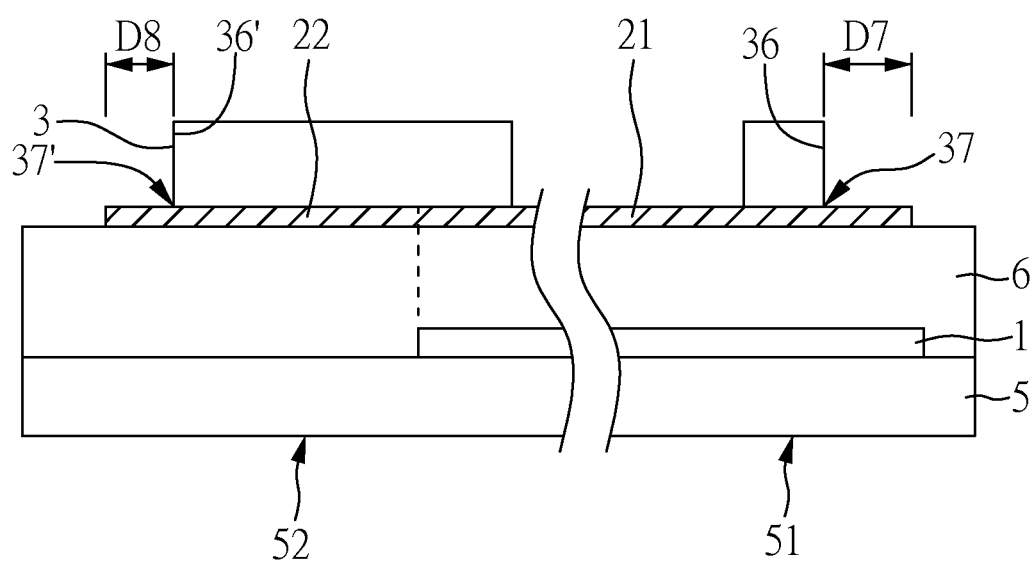
FIG. 7 shows the cross-sectional view of the pixel structure according to further another preferable embodiment of the present invention.

Another part of cross-sectional view of the pixel structure as shown in FIG. 7, a semiconductor layer 2 may have a first portion 21 and a second portion 22, wherein the first conductive layer 1 locates between the first portion 21 and the substrate 5, and first conductive layer 1 doesn't locate between the second portion 22 and the substrate 5; the contact border 37' and the neighboring side of the first portion 21 are separated by an interval of a seventh distance D7, the contact border 37' and the neighboring side of the second portion 22 are separated by an interval of a eighth distance D8, and the seventh distance D7 is greater than the eighth distance D8. In the present embodiment, the seventh distance D7 may be in a range of 1 µm to 2 µm.

Therefore, in order to reduce resistance, the distance between the second conductive layer 3 and the neighboring side of the semiconductor layer 2 in non-display region 51 should be greater than that between the second conductive layer 3 and the neighboring side of the semiconductor layer 2 in display region 52. Besides, if the distance (i.e. sixth distance D6) in display region 52 between the semiconductor layer 2 and the data line thereon increases, parasite capacitance between the semiconductor layer 2 and the first conductive layer 1 thereunder may also increase, so that efficiency of the liquid crystal is getting worse. To avoid affecting efficiency of the liquid crystal, the seventh distance D7 in non-display region 51 is set to greater than the sixth distance D6 and the eighth distance D8 in display region 52 preferably.

The display device of the present invention may be completely fabricated by the people skilled in the art, so we will not go further on this here. The first conductive layer 1, the second conductive layer 3 may use the common conducting material in the art such as metal, alloy, metallic oxide, metallic nitrogen-oxide, or other common electrode material in the art; and preferably is metal. The substrate 5 may use the common substrate material such as glass substrate, plastic substrate, silicon substrate, ceramic substrate. The insulation layer 6 may use the common gate insulating material such as silicon nitride (SiN); and the semiconductor layer may use the common semiconducting material, including amorphous silicon, poly silicon, or organic material such as P13, DH4T, and pentacene.

In the embodiment illustrated above, it will be understood by those skilled in the art that some components in display device has been omitted, for example the pixel structure of the aforementioned embodiment can combine with a colorful optical filter substrate, liquid crystal layer, backlight module to form a liquid crystal display device. The display device of the present invention can be a variety of flat panel display, for example, it can be a liquid crystal display (LCD), or an organic light emitting diode display (OLED); practical application such as car displays, electromagnetic isolation glass, cell phones, solar cells, portable LCD video games, home appliances LCD panel, instrument displays, organic light-emitting diode displays, LCD monitors, notebook computers, LCD TVs, plasma monitors, color filters electrodes or the combination thereof.

Although the present invention has been explained in relation to its preferred embodiment, it is to be understood that many other possible modifications and variations can be made without departing from the spirit and scope of the invention as hereinafter claimed.

What is claimed is:

1. A display device, comprising:
   a substrate comprising a display region and a non-display region outside the display region;
   a first conductive layer disposed on the substrate;
   a semiconductor layer disposed on the first conductive layer, wherein the semiconductor layer has a first side in the display region and a second side in the non-display region; and
   a second conductive layer disposed on a top surface of the semiconductor layer, wherein the second conductive layer has a third side in the display region and a fourth side in the non-display region, the third side has a first contact border contacting the top surface, and the fourth side has a second contact border contacting the top surface;
   wherein the first side of the semiconductor layer is adjacent to the first contact border of the second conductive layer, and the second side of the semiconductor layer is adjacent to the second contact border of the second conductive layer;
   wherein a first interval is between the first side of the semiconductor layer and the first contact border of the second conductive layer, and a second interval is between the second side of the semiconductor layer and the second contact border of the second conductive layer;
   wherein the first interval is smaller than the second interval.

2. The display device of claim 1, wherein the semiconductor layer has a first portion and a second portion, the first conductive layer is located between the first portion and the substrate, the second portion doesn't overlap the first conductive layer.

3. The display device of claim 2, wherein a third interval is between the first portion of the semiconductor layer and the first contact border of the second conductive layer, and a fourth interval is between the second portion of the semiconductor layer and the second contact border of the second conductive layer; wherein the third interval is smaller than the fourth interval in the non-display region.

4. The display device of claim 3, wherein the third interval is in a range from 1 µm to 2 µm.

5. The display device of claim 2, wherein a third interval is between the first portion of the semiconductor layer and the first contact border of the second conductive layer, and a fourth interval is between the second portion of the semiconductor layer and the second contact border of the second conductive layer; wherein the third interval is smaller than the fourth interval in the non-display region.

6. The display device of claim 5, the third interval is in a range from 0.3 µm to 1 µm, the fourth interval is in a range from 0.7 µm to 1.5 µm.

7. The display device of claim 1, wherein the second conductive layer comprises a data line in the display region, wherein the data line, the first conductive layer and the semiconductor layer form a thin film transistor, the data line has a fifth side and a sixth side, the sixth side is opposite to the fifth side, and the fifth side is near to the a channel of the thin film transistor; and
   wherein the first interval is between the sixth side of the data line on the substrate and the first side of the semiconductor layer on the substrate.

8. The display device of claim 1, wherein the second conductive layer further comprises a circuit line, the second interval is between one side of the circuit line and the first side of the semiconductor layer.

9. The display device of claim 1, wherein the second interval is in a range from 0.7 µm to 2.0 µm.

10. The display device of claim 1, wherein the first interval is in a range from 0.3 µm to 1.5 µm.

11. The display device of claim 1, wherein a shape profile of the third side of the second conductive layer is the same as a shape profile of the first side of the semiconductor layer.

12. The display device of claim 1, wherein the second conductive layer and the semiconductor layer are patterned with a gray tone mask.

* * * * *